United States Patent [19]
Endo

[11] Patent Number: 5,524,017
[45] Date of Patent: Jun. 4, 1996

[54] QUANTUM WELL SEMICONDUCTOR LASER

[75] Inventor: Kenji Endo, Tokyo, Japan

[73] Assignee: NEC Corporation, Tokyo, Japan

[21] Appl. No.: 385,821

[22] Filed: Feb. 9, 1995

[30] Foreign Application Priority Data

Feb. 10, 1994 [JP] Japan ................................. 6-036330

[51] Int. Cl.⁶ ........................................................ H01S 3/19
[52] U.S. Cl. ........................................... 372/46; 372/45
[58] Field of Search .............................. 372/45, 46, 44, 372/50

[56] References Cited

U.S. PATENT DOCUMENTS

| | | | |
|---|---|---|---|
| 4,523,317 | 6/1985 | Botez | 372/45 |
| 4,546,480 | 10/1985 | Buruham et al. | 372/45 |
| 4,546,481 | 10/1985 | Yamamoto et al. | 372/45 X |
| 4,813,050 | 3/1989 | Shima et al. | 372/45 |
| 4,815,082 | 3/1989 | Isshiki et al. | 372/45 |
| 5,018,158 | 5/1991 | Okada et al. | 372/45 |
| 5,450,437 | 9/1995 | Shim et al. | 372/46 X |

FOREIGN PATENT DOCUMENTS

| | | |
|---|---|---|
| 4-181788 | 6/1992 | Japan . |
| 4-206982 | 7/1992 | Japan . |

OTHER PUBLICATIONS

Paper C131, Proceedings of the 1991 IEICE Fall Conference, Sep. 5–8, 1991, Tokyo, Japan.

*Primary Examiner*—James W. Davie
*Attorney, Agent, or Firm*—Popham, Haik, Schnobrich & Kaufman, Ltd.

[57] ABSTRACT

In a quantum well semiconductor laser in which a stripe-like multilayered structure having a cladding layer of a first conductivity type, a quantum well active layer, and a cladding layer of a second conductivity type is formed on a semiconductor substrate or a semiconductor base layer, and multilayered structures identical to the stripe-like multilayered structure are formed along two sides of the stripe-like multilayered structure with grooves interposed in between, where each groove has a width smaller at portions near end face portions of a resonator than at a central portion thereof, and a quantum well layer of the quantum well active layer has a smaller thickness at the portions near the end face portions of the resonator than at the central portion thereof.

5 Claims, 4 Drawing Sheets

QUANTUM WELL SEMICONDUCTOR LASER

BACKGROUND OF THE INVENTION

1. Field of the Invention

The present invention relates to a quantum well semiconductor laser and, more particularly, to a quantum well semiconductor laser with a window structure free from optical output absorption at an end face portion.

2. Description of the Prior Art

The end face portion of a semiconductor laser absorbs a portion of an optical output and its temperature rises locally. For this reason, oxidation of the crystal progresses at the end face portion during a long-term operation to degrade the semiconductor laser. In addition, local thermal runaway occurs in the crystal at the end face portion during a high optical output operation to melt the crystal, thereby instantaneously degrading the semiconductor laser. As a method of reducing this optical absorption at the end face portion, there is known a semiconductor laser with a window structure including a semiconductor layer having a larger band gap than the wavelength energy of the optical output at the end face portion.

Various types of semiconductor lasers with a window structure are available. One such structure has a quantum well active layer which is thin only near an end face portion by utilizing the fact that the effective band gap increases with a decrease in thickness of the quantum well layer of a quantum well semiconductor laser. For example, in a semiconductor laser described in Japanese Unexamined Patent Publication No. 4-206982, a projecting mesa structure sided laterally by a terrace structure is formed on a semiconductor substrate by etching beforehand. An active layer is formed on the mesa projection. The active layer is thick at a portion where the terrace structure is closeby and thin at a portion near an end face portion where the terrace structure is absent or distant, thereby forming a window structure.

On the other hand, a selective metal organic chemical vapor deposition (MOCVD) growth method in which parts of the surface of a semiconductor substrate is covered with an $SiO_2$ film has been attempted. Paper C-131 in the Proceedings of the 1991 IEICE Fall conference describes a method of manufacturing a semiconductor laser in which an InP substrate is covered with a pair of $SiO_2$ masks, and an InGaAs multiple quantum well layer and an optical waveguide including an InP cladding layer are selectively grown in a stripe region sandwiched by these masks. This paper reports that a smooth (111)B surface is formed on the side surface of a selectively grown portion, and that the selective growth rate is associated with the width of the masks.

A conventional quantum well semiconductor laser with a window structure requires a complicated manufacturing method and is manufactured through a fine etching process, an impurity diffusion process, a crystal growth process requiring strict process management, and the like. The etching process and the diffusion process tend to cause crystal defects, thereby frequently degrading the quantum well semiconductor laser. In the conventional manufacturing method, it is difficult to increase the difference between the effective band gap of an active layer in a window structure portion and the effective band gap of an active layer in an oscillation region. For this reason, relatively large optical absorption occurs at an end face portion, and an end face degradation preventive effect of the window structure is insufficient.

In the semiconductor laser described in Japanese Unexamined Patent Publication No. 4-206982 as an example, the difference between the thicknesses of well layers of active layers in an end face portion and an laser oscillation region is associated with many factors such as the width of a mesa projection, the distance from the mesa projection, the depth of a groove, and the crystal growth rate. These factors, in turn, are also factors influencing formation of an optical waveguide and a current constriction structure, thus presenting contradictory conditions. It is therefore difficult to form an effective window structure. In addition, since an active multilayered film is grown on a substrate crystal with a stepped structure, crystal defects which lead to degradation of the laser tend to form with a high possibility.

In the selective growth method for covering the surface of a semiconductor substrate with a dielectric film, a polycrystalline film inevitably grows on the dielectric film in an Al-containing semiconductor layer of, e.g., AlGaAs or AlGaInP. This method can, therefore, be applied only to a semiconductor laser having a cladding layer not containing Al, such as an InP cladding layer. A semiconductor laser having window structures at two end face portions using this selective growth has not yet been reported.

SUMMARY OF THE INVENTION

The present invention has been made to solve the conventional problems described above, and has as its object to provide a quantum well semiconductor laser having low power consumption, excellent oscillation characteristics and a long service life, and capable of generating a high output.

In order to achieve the above object according to the principal aspect of the present invention, there is provided a quantum well semiconductor laser in which a stripe-like multilayered structure having a cladding layer of a first conductivity type, a quantum well active layer, and a cladding layer of a second conductivity type is formed on a semiconductor substrate or a semiconductor base layer, and multilayered structures identical to the stripe-like multilayered structure are formed along two sides of said stripe-like multilayered structure with grooves interposed in between, wherein each groove has a width smaller at portions near end face portions of a resonator than at a central portion thereof, and a quantum well layer of the quantum well active layer has a smaller thickness at the portions near the end face portions of the resonator than at the central portion thereof.

According to the semiconductor laser of the present invention, a window structure is formed by utilizing the fact that crystal growth near the portions covered with the growth inhibition masks is associated with the size of an area covered with the growth inhibition masks. Crystal growth does not progress on the growth inhibition masks, and a supplied source gas is diffused to influence crystal growth near the masks. In crystal growth of a Group III–V semiconductor layer, since crystal growth is generally performed in a condition wherein a Group V material is excessive, the growth rate is mostly determined by the supply amount of a Group III source gas. Since the Group III source gas supplied onto the growth inhibition masks diffuses to the nearby semiconductor surface this increases the growth rate. This effect is enhanced when the area covered with the growth inhibition mask becomes larger.

When the pair of stripe-like growth inhibition masks whose widths are narrow near the end face portions and wide inside the resonator are used to perform crystal growth of the active layer waveguide, a quantum well active layer thick at the central portion and thin near the end face portions can be formed. At this time, the side surface of the selectively grown region has a smooth (111)B surface, thereby forming an optical waveguide having a small scattering loss.

As for a semiconductor layer having constituent elements including Al, HCl is added to perform crystal growth to prevent polycrystalline growth on the growth inhibition masks, thereby providing a semiconductor laser having good crystallinity.

In addition, according to the quantum well semiconductor laser of the present invention, the growth inhibition masks which are narrow near the end face portions of the resonator and wide at portion except for the end face portions are formed at the two sides of a region in which an active layer is to be grown, and a quantum well active layer is formed in accordance with metal organic chemical vapor deposition. According to the manufacturing method of the present invention, crystal growth can be performed on an almost flat semiconductor surface. For this reason, an active layer waveguide having high crystal quality with little variations can be formed. In addition, by appropriately setting the width of each growth inhibition mask a wide-range control of the difference between the thicknesses of the active layers near the end face portions and the region inside the resonator is possible. Therefore, a window structure having low optical absorption and an enhanced end face degradation preventive effect can be formed. Therefore, a semiconductor laser having a long service life and capable of generating a high output can be realized. In particular, a semiconductor laser suitable as an optical disk light source in the wavelength range of 0.7 to 0.8 μm, an intersatellite space optical communication light source in the wavelength range of 0.8 μm, or an optical fiber amplifier excitation light source in the wavelength range of 0.98 or 1.02 μm can be realized.

In a semiconductor laser having a burying layer according to the present invention, a stable fundamental transverse mode can be maintained in a wide optical output range while allowing a window structure to effect the end face degradation preventive effect because a burying layer having a sufficiently large refractive index difference as compared to a change in refractive index which is caused by current injection can be formed. In addition, since the optical waveguide has a low loss and the width of the oscillation region can be still narrowed, a semiconductor laser having a small threshold current value and a high slope efficiency, and hence having low power consumption can be realized. According to the present invention, a semiconductor laser having oscillation characteristics much better than those of a semiconductor laser having a conventional structure employing a wide optical waveguide having a small refractive index difference can be realized.

The above and other advantages, features and additional objects of the present invention will become manifest to those versed in the art upon making reference to the following detailed description and accompanying drawings in which preferred embodiments incorporating the principle of the present invention are shown by way of illustrative example.

DETAILED DESCRIPTION OF THE PREFERRED EMBODIMENTS

A few preferred embodiments of the present invention will be described with reference to the accompanying drawings.

Figure 1A:
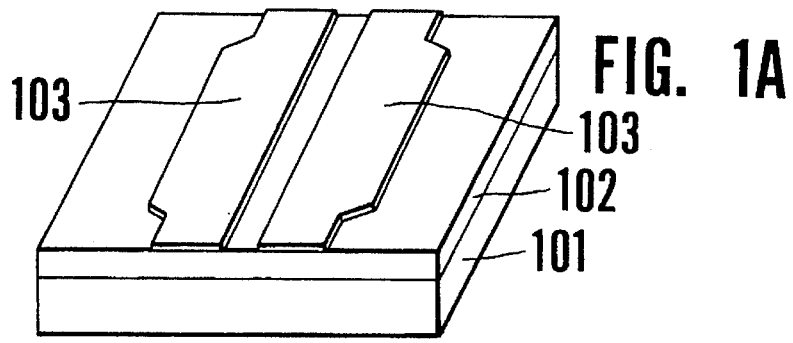
FIGS. 1A to 1D are perspective views for explaining the steps in manufacturing a semiconductor laser according to the first embodiment of the present invention.

First of all, the first embodiment of the present invention will be described with reference to FIGS. 1A to 1D and 2A and 2B. As shown in FIG. 1A, an n-type GaInP base layer 102 is grown on the (100) surface of an n-type GaAs substrate 101. Growth inhibition masks 103 consisting of SiO$_2$ are formed at two sides of a stripe region in the [011] direction. The width of each growth inhibition mask 103 is narrow near the end faces of a resonator and wide at its central portion.

Figure 1B:
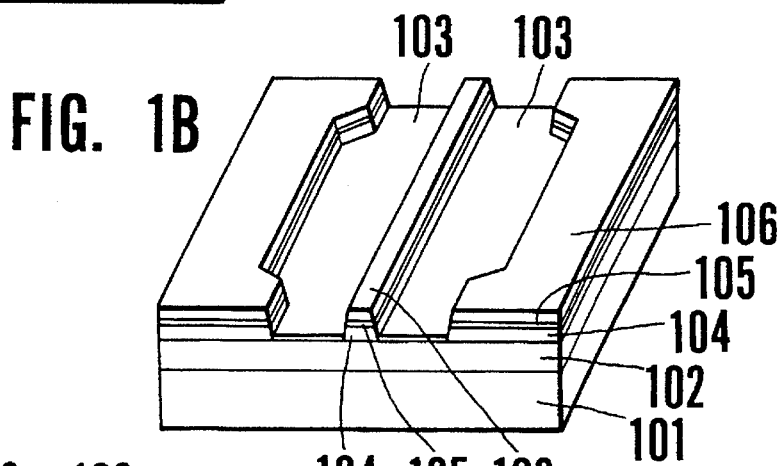

As shown in FIG. 1B, n-type GaInP cladding layers 104, InGaAs quantum well active layers 105, and p-type GaInP cladding layers 106 are sequentially formed by metal organic chemical vapor deposition.

Crystal growth does not occur on the growth inhibition masks, and multilayered structure active layers are formed on the exposed crystal surface portions of the n-type GaInP base layer 102. An active layer waveguide whose side surfaces are smooth (111)B crystal faces is formed in the stripe region interposed by the growth inhibition masks 103. The width of this active layer waveguide is determined in correspondence with the width of the stripe region, and its controllability is excellent.

Since crystal growth does not occur on the growth inhibition masks 103, the growth rate is increased by a source gas diffused from the masks at portions near the growth inhibition masks 103. As the width of each mask gets larger, the amount of source gas supplied increases. For this reason, a thick crystal layer is formed at the central portion of the stripe region. On the other hand, since the mask width is narrow near the end faces of the resonator, the thickness of the active layer waveguide, and particularly the thickness of the quantum well layer of the active layer are smaller than that at the central portion of the resonator where the mask width is large. Note that the quantum well layer of the active layer has a general multilayered structure including an InGaAs well layer, a GaAs barrier layer, and an InGaAsP barrier layer.

Figure 1C:
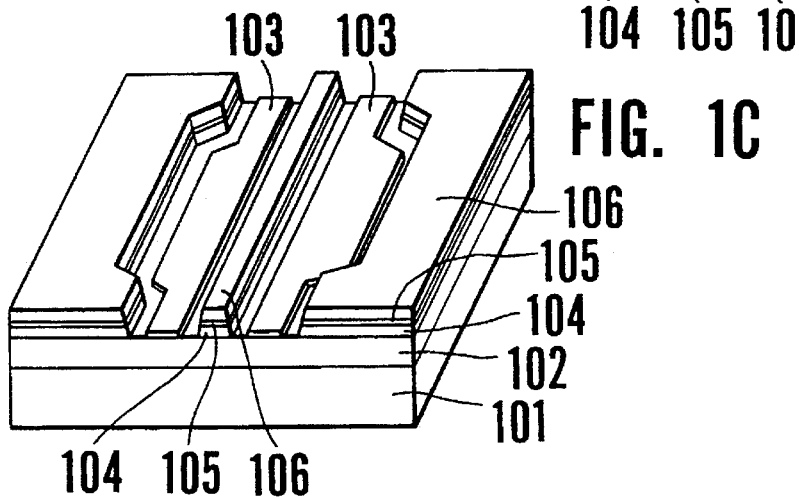
Figure 1D:
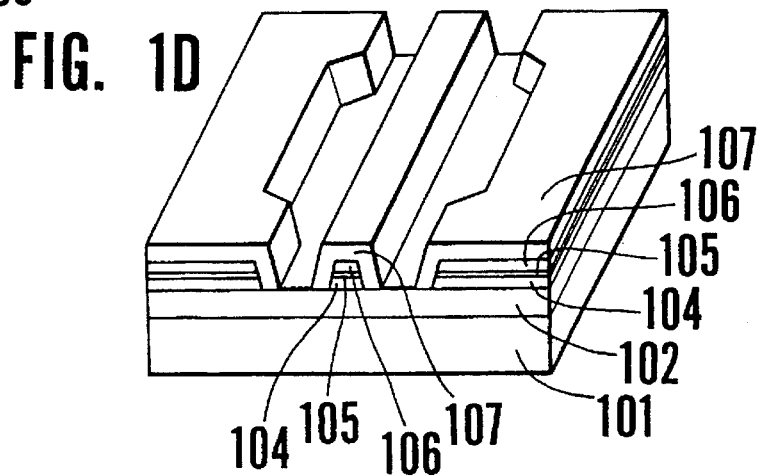

As shown in FIG. 1C, the end portions, near the crystal growth layers, of the growth inhibition masks 103 are selectively etched to partially expose the surface portions of the n-type GaInP base layer 102. A p-type GaInP burying layer 107 is epitaxially grown. The p-type GaInP burying layer 107 is also formed on the (111)B surfaces of the active layer waveguide assisted by crystal growth on the newly exposed surface portions of the n-type GaInP base layer. For this reason, when the remaining growth inhibition masks 103 are removed, a structure in which the active layer waveguide is buried by the p-type GaInP buried layer 107 is formed, as shown in FIG. 1D.

Figure 2A:
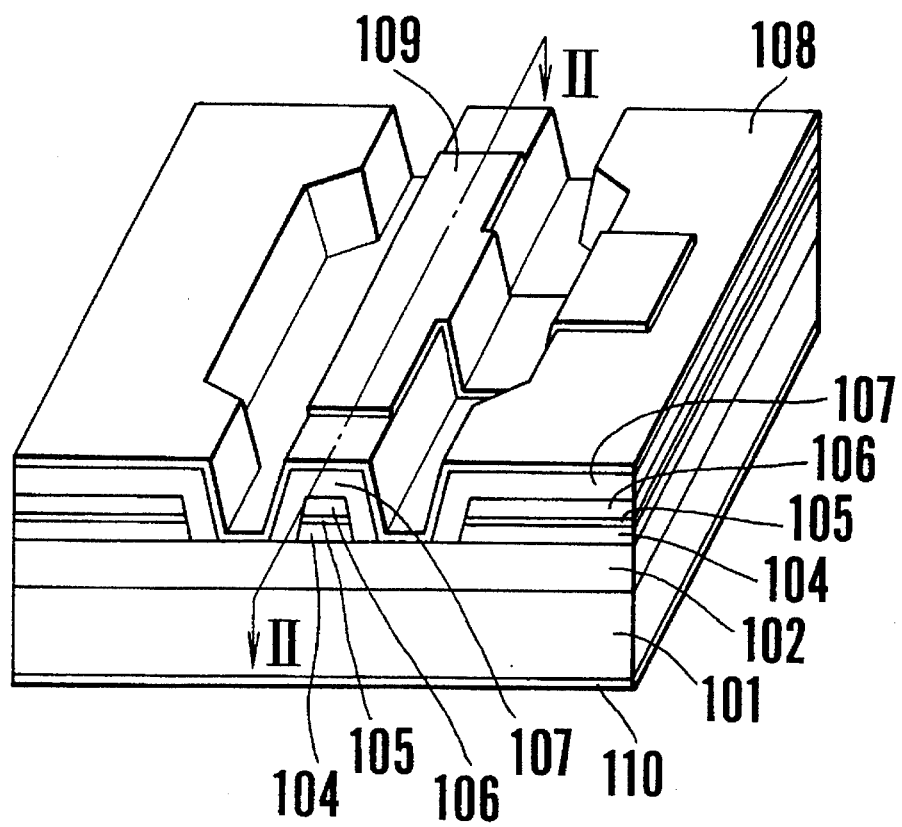
FIGS. 2A and 2B are, respectively, a perspective view of the first embodiment of the present invention and a sectional view thereof along the line II—II in FIG. 2A.

An insulating film 108 is formed on the entire surface of the resultant structure, and a window is formed in the central portion of the active layer waveguide. A p-side electrode 109 is formed in the window. To reduce ineffective current, the electrode is formed only on an active layer waveguide portion except for the portion near the end faces of the resonator. The p-side electrode 109 is extended onto the insulating film 108 formed outside the active layer waveguide to allow lead bonding. An n-side electrode 110 is formed on the lower surface of the substrate. The structure of the finished semiconductor laser is shown in FIGS. 2A and 2B.

Figure 2B:
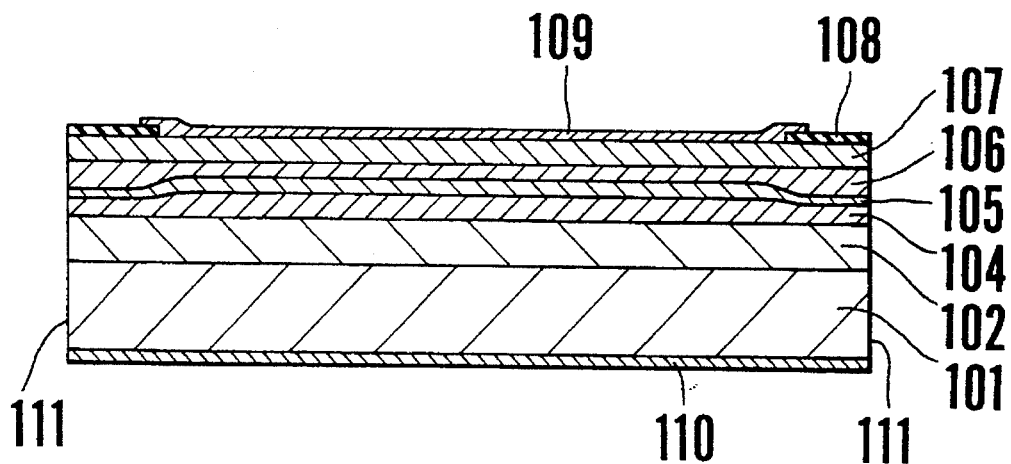

As shown in FIG. 2B which is a sectional view along the resonator direction (the line II—II in FIG. 2A), at least the well layer of the InGaAs quantum well active layer 105 has a small thickness near end faces 111 of the resonator and a large thickness at its central portion. For this reason, the effective band gap of the quantum well layer of the active layer near the end faces 111 of the resonator is larger than the wavelength energy of the optical output determined by the central portion of the active layer, thereby reducing the absorption coefficient for the optical output. Therefore, a semiconductor laser having a long service life and end faces free from degradation can be realized.

This structure can be formed by epitaxial growth on a flat surface and does not require an etching process for forming a groove in a semiconductor crystal. Therefore, an active layer waveguide can be constituted by a high-quality crystal layer with little crystal defects.

Figure 3A:
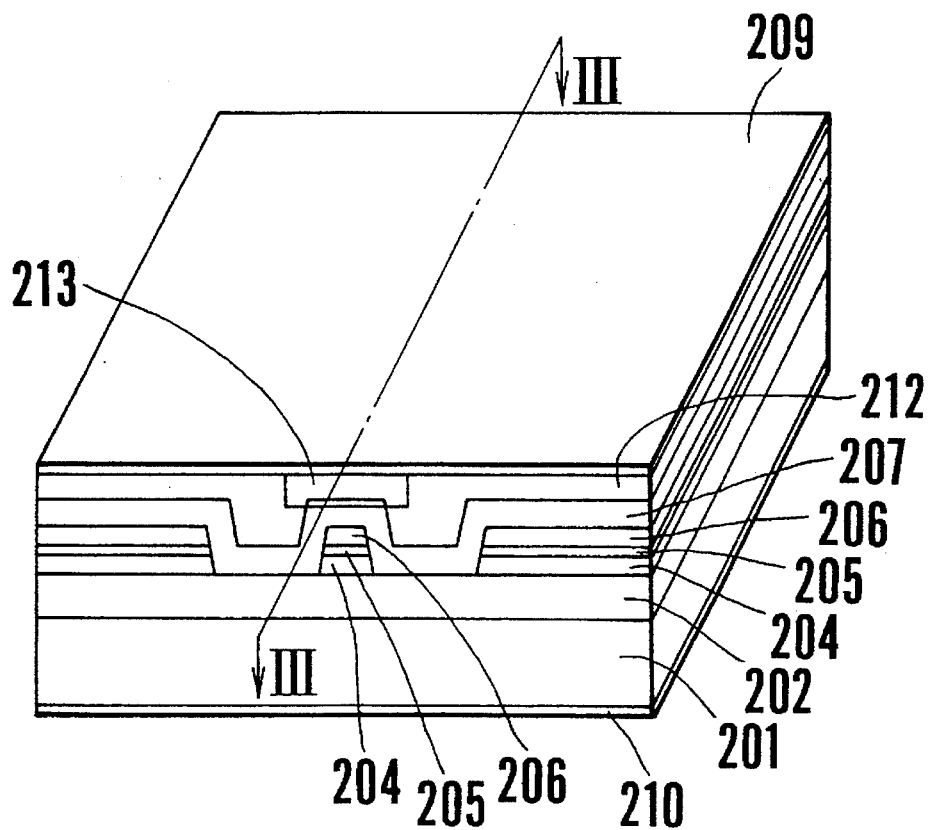
FIGS. 3A and 3B are, respectively, a perspective view of the first embodiment of the present invention and a sectional view thereof along the line III—III in FIG. 3A.
Figure 3B:
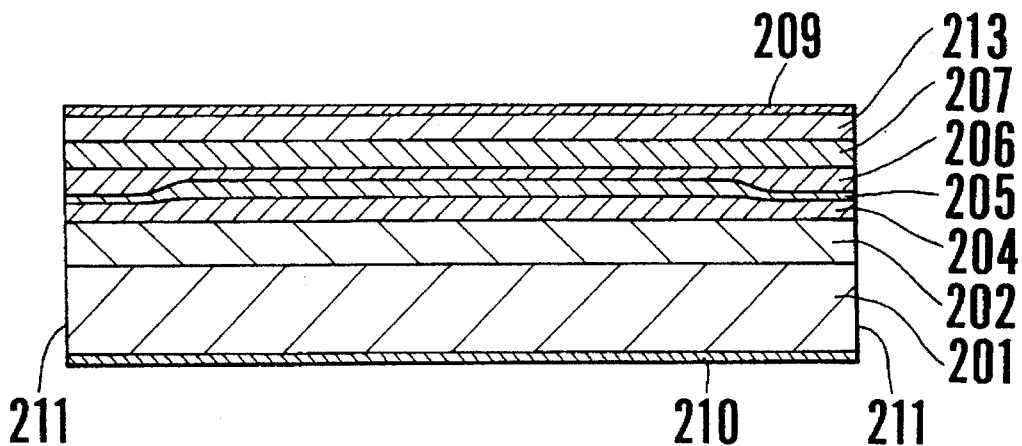

FIGS. 3A and 3B are a perspective view of the second embodiment of the present invention and a sectional view thereof along the line III—III in FIG. 3A, respectively. An active layer of a semiconductor laser of this embodiment is manufactured following substantially the same procedures as in FIGS. 1A to 1D. More specifically, an n-type GaInP base layer 202 is formed on an n-type GaAs substrate 201, and growth inhibition masks (not shown) are formed. Subsequently, n-type GaInP cladding layers 204, InGaAs quantum well active layers 205, and p-type GaInP cladding layers 206 are sequentially epitaxially grown by metal organic chemical vapor deposition. In the step corresponding to FIG. 1C, the growth inhibition masks are removed from the entire surface. A p-type GaInP buried layer 207 and an n-type GaAs cap layer 212 are grown. In this embodiment, since the growth inhibition masks are removed from the entire surface and a buried layer is then grown, the p-type GaInP buried layer 207 is grown on the entire surface. In addition, the n-type GaAs cap layer 212 planarizes the surface to obtain an almost flat device surface.

To form a current constriction structure, a p-type impurity is diffused in the upper portion of the active layer waveguide to form a p-type impurity diffusion region 213 reaching the p-type GaInP burying layer 207 in the n-type GaAs cap layer 212. Finally, p- and n-side electrodes 209 and 210 are formed on the upper and lower surfaces of the element to finish the manufacture of the laser of this embodiment. Note that the p-type impurity diffusion region 213 may be formed only in the central portion other than portions near end faces 211 of the resonator.

In the semiconductor laser of this embodiment, the semiconductor crystal is buried around the active layer waveguide, and the p-side electrode 209 side serves as a mount surface, thereby improving the heat dissipation characteristics. The resultant structure is a structure suitable for a high-output semiconductor laser having high power consumption.

Figure 4A:
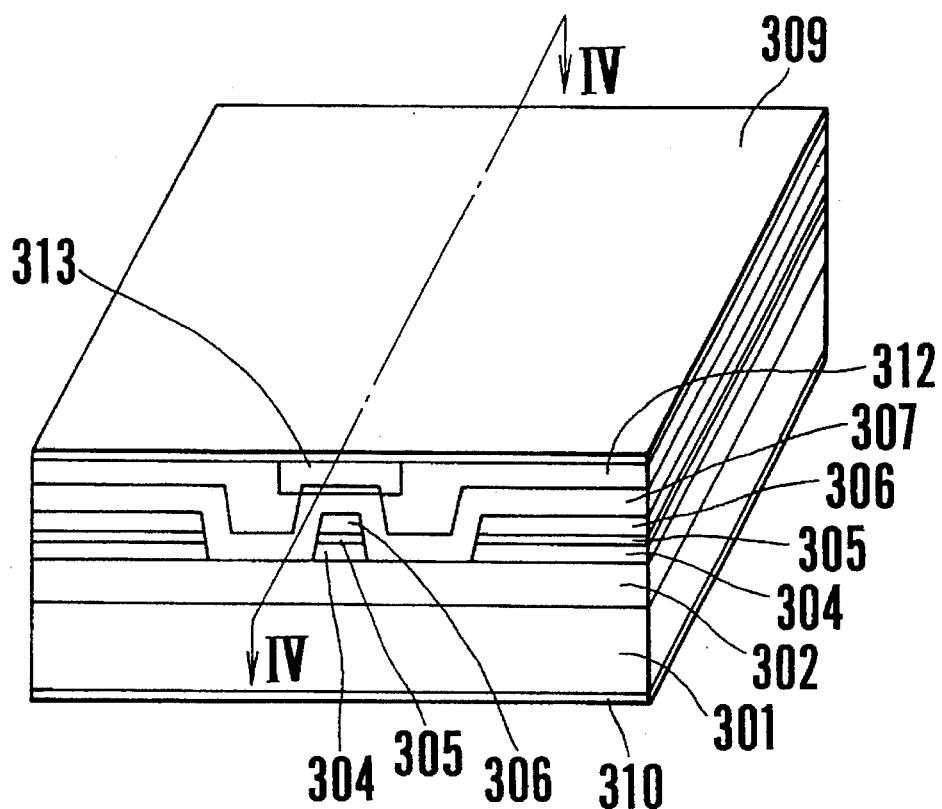
FIGS. 4A and 4B are, respectively, a perspective view of the first embodiment of the present invention and a sectional view thereof along the line VI—VI in FIG. 4A.
Figure 4B:
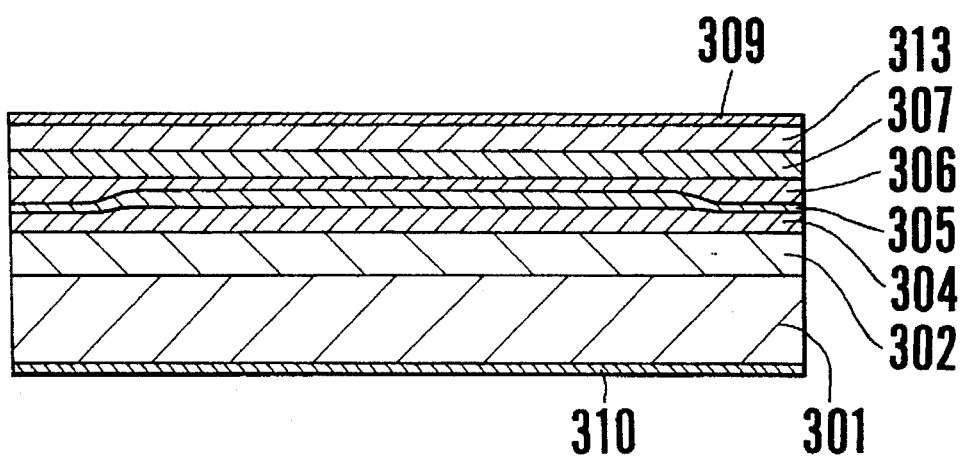

FIG. 4A is a perspective view of the third embodiment of the present invention, and FIG. 4B is a sectional view thereof along the line IV—IV in FIG. 4A. The same reference numerals as in FIGS. 3A and 3B denote the same or corresponding parts in FIGS. 4A and 4B, and a repetitive description will be omitted. In a semiconductor laser of the third embodiment, growth inhibition masks (not shown) consisting of silicon nitride ($SiN_x$) are formed on an n-type GaInP base layer 302. N-type AlGaAs cladding layers 304, InGaAs quantum well active layers 305, and p-type AlGaAs cladding layers 306 are selectively grown on the base layer, thereby obtaining the semiconductor laser. In this case, to selectively grow a crystal layer containing Al as a constituent element, HCl is added to a source gas. Other processes are the same as those of the second embodiment.

In the third embodiment, metal organic chemical vapor deposition is performed such that $SiN_x$ films are used as the growth inhibition masks and Hcl is added to the source gas. Growth of polycrystalline AlGaAs on the growth inhibition masks can be prevented. The present invention is also applicable to selective growth of a crystal containing Al as a constituent element. In the arrangement of this embodiment, even if a quantum well layer having a large band gap is used as a cladding layer, overflow of injection carriers into the cladding layer can be :minimized, thereby realizing an element having excellent characteristics.

The present invention has been described with reference to the preferred embodiments. However, the present invention is not limited to the semiconductor materials, the arrangement of the active layer quantum well structure, the cladding layer, and the like, all of which are described in the above embodiment. Various changes and modifications can be made within the spirit and scope of the invention. For example, in an embodiment described above, a GaAs substrate is used. However, an InP substrate may be used. In addition, a cladding layer and an active layer may be directly and selectively grown on a substrate.

What is claimed is:

1. A quantum well semiconductor laser in which a stripe-like multilayered structure having a cladding layer of a first conductivity type, a quantum well active layer, and a cladding layer of a second conductivity type is formed on a semiconductor substrate or a semiconductor base layer, and multilayered structures identical to said stripe-like multilayered structure are formed along two sides of said stripe-like multilayered structure with grooves interposed in between, wherein each groove has a width smaller at portions near end face portions of a resonator than at a central portion thereof, and a quantum well layer of said quantum well active layer has a smaller thickness at the portions near said end face portions of said resonator than at the central portion thereof.

2. The laser according to claim 1, wherein said stripe-like multilayered structures and said multilayered structures separated therefrom with grooves are covered with a burying layer.

3. The laser according to claim 1, wherein said semiconductor base layer consists of GaInP.

4. The laser according to claim 1, wherein said quantum well layer consists of InGaAs, and said cladding layer consists of GaInP.

5. The laser according to claim 1, wherein said quantum well layer consists of InGaAs, and said cladding layer consists of AlGaAs.

* * * * *